(12) United States Patent
Lai

(10) Patent No.: US 9,214,602 B2
(45) Date of Patent: Dec. 15, 2015

(54) CHIP UNIT WITH PROTRUSIONS FOR INTERLOCKING MECHANISM AND METHOD FOR MANUFACTURING THE SAME

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 137 days.

(21) Appl. No.: 13/914,643

(22) Filed: Jun. 11, 2013

(65) Prior Publication Data

US 2014/0175496 A1   Jun. 26, 2014

(30) Foreign Application Priority Data

Dec. 21, 2012   (TW) .............................. 101149091 A

(51) Int. Cl.
*G02B 6/42*   (2006.01)
*H01L 33/20*   (2010.01)
*H01L 25/075*   (2006.01)

(52) U.S. Cl.
CPC .............. *H01L 33/20* (2013.01); *G02B 6/4261* (2013.01); *H01L 25/0753* (2013.01); *H01L 2924/0002* (2013.01)

(58) Field of Classification Search
CPC .......... G02B 6/426–6/4261; H01L 2224/1308; H01L 2224/1309; H01L 2924/01028; H01L 2224/13155; H01L 25/0753
USPC ............................ 257/594, E33.057, E33.058
See application file for complete search history.

(56) References Cited

U.S. PATENT DOCUMENTS

| 5,779,924 | A  | * | 7/1998  | Krames et al. .................... 216/24 |
| 5,909,052 | A  | * | 6/1999  | Ohta et al. ....................... 257/627 |
| 6,084,298 | A  | * | 7/2000  | Sugahara ......................... 257/701 |
| 6,335,271 | B1 | * | 1/2002  | Fukuyama ...................... 438/616 |
| 6,495,914 | B1 | * | 12/2002 | Sekine et al. ................... 257/723 |
| 6,864,570 | B2 | * | 3/2005  | Smith ............................ 257/703 |
| 7,470,938 | B2 | * | 12/2008 | Lee et al. ....................... 257/103 |
| 7,683,386 | B2 | * | 3/2010  | Tanaka et al. .................... 257/88 |
| 8,008,646 | B2 | * | 8/2011  | Leem ............................... 257/13 |
| 8,242,532 | B2 | * | 8/2012  | Sato et al. ...................... 257/103 |
| 8,664,019 | B2 | * | 3/2014  | Lee et al. ....................... 438/29 |
| 8,946,748 | B2 | * | 2/2015  | Kim et al. ....................... 257/98 |
| 2002/0158323 | A1 | * | 10/2002 | Iwasaki ......................... 257/679 |
| 2003/0057444 | A1 | * | 3/2003  | Niki et al. ...................... 257/200 |
| 2004/0041156 | A1 | * | 3/2004  | Tsuda et al. ..................... 257/79 |
| 2005/0001227 | A1 | * | 1/2005  | Niki et al. ....................... 257/98 |
| 2005/0164485 | A1 | * | 7/2005  | Onozawa ........................ 438/616 |
| 2005/0224988 | A1 | * | 10/2005 | Tuominen ....................... 257/774 |
| 2006/0139963 | A1 | * | 6/2006  | Chang et al. ..................... 362/633 |
| 2006/0231852 | A1 | * | 10/2006 | Kususe et al. ................... 257/99 |
| 2006/0273341 | A1 | * | 12/2006 | Lee et al. ....................... 257/103 |

(Continued)

*Primary Examiner* — William F Kraig
*Assistant Examiner* — Maliheh Malek
(74) *Attorney, Agent, or Firm* — Novak Druce Connolly Bove + Quigg LLP

(57) ABSTRACT

A chip unit includes a base and two chips. Each chip includes a substrate, a first semiconductor layer, a light emitting layer, a second semiconductor layer and an electrode. The substrate forms a groove in a bottom face thereof and two blocks besides the groove. The base forms a protrusion on a top face thereof and two slots besides the protrusion. The protrusion is fittingly received in the groove, and the two blocks are fittingly received in the two slots, respectively. A method for manufacturing the chip unit is also disclosed.

8 Claims, 8 Drawing Sheets

(56) References Cited

U.S. PATENT DOCUMENTS

| | | | |
|---|---|---|---|
| 2007/0069222 A1* | 3/2007 | Ko et al. | 257/86 |
| 2007/0267644 A1* | 11/2007 | Leem | 257/98 |
| 2008/0035948 A1* | 2/2008 | Shin et al. | 257/99 |
| 2008/0105892 A1* | 5/2008 | Shen | 257/99 |
| 2008/0217761 A1* | 9/2008 | Yang et al. | 257/700 |
| 2010/0059897 A1* | 3/2010 | Fay et al. | 257/777 |
| 2012/0002427 A1* | 1/2012 | Moon et al. | 362/382 |
| 2012/0012856 A1* | 1/2012 | Chen et al. | 257/76 |
| 2013/0015487 A1* | 1/2013 | Okuno | 257/98 |
| 2013/0129276 A1* | 5/2013 | Lin et al. | 385/14 |
| 2013/0270427 A1* | 10/2013 | Hsiao et al. | 250/227.28 |
| 2014/0061906 A1* | 3/2014 | Liao | 257/738 |
| 2014/0103369 A1* | 4/2014 | Pu et al. | 257/88 |
| 2014/0197440 A1* | 7/2014 | Ye et al. | 257/98 |
| 2014/0197441 A1* | 7/2014 | Ye et al. | 257/98 |

* cited by examiner

CHIP UNIT WITH PROTRUSIONS FOR INTERLOCKING MECHANISM AND METHOD FOR MANUFACTURING THE SAME

BACKGROUND

1. Technical Field

The disclosure generally relates to a chip unit, and more particularly, to a chip unit for illumination.

2. Description of Related Art

Nowadays LEDs (light emitting diodes) are applied widely in displays for illuminating the screens thereof. A high-power LED often includes a plurality of chips to obtain enough intensity. Generally, the chips are mounted very close to each other on a same base. However, such close arrangement of the chips requires very high mounting precision of the chips on the base. A small deviation of the chip from the target position may cause the chip to be positioned askew or even to overlap with adjacent chips.

What is needed, therefore, is a chip unit which can address the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the various views.

DETAILED DESCRIPTION

Figure 1:
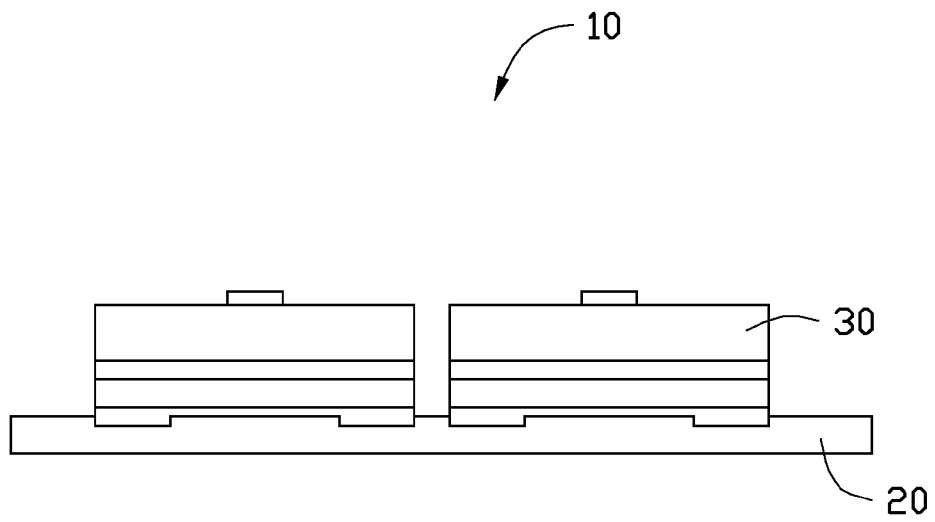
FIG. 1 shows a chip unit in accordance with an embodiment of the present disclosure.
Figure 2:
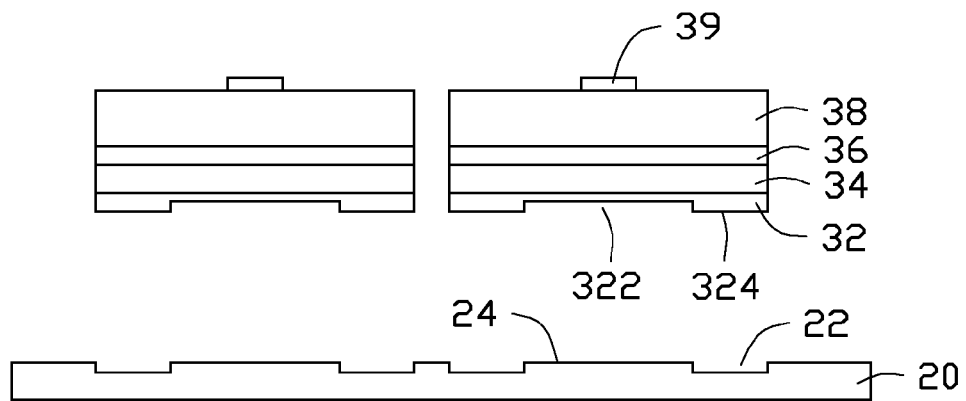
FIG. 2 is an exploded view of the chip unit of FIG. 1.

Referring to FIGS. 1-2, a chip unit 10 in accordance with an embodiment of the present disclosure is shown. The LED unit 10 includes a base 20 and two chips 30 mounted on the base 20. The base 20 may be mounted on a circuit board (not shown), or act as a circuit board by itself to supply power for the chips 30. When the base 20 is for being mounted on the circuit board, it may be made of heat-conductive and electrically insulating material, such as ceramic. When the base 20 acts as the circuit board, it may be a metal plate with an electrically insulating layer and a circuit pattern sequentially formed thereon. The base 20 can rapidly and effectively dissipate heat generated from the chips 30 to an environmental atmosphere. The base 20 has two slots 22 and a protrusion 24 formed on a top face thereof, corresponding to each chip 30. The protrusion 24 is located between the two slots 22. The protrusion 24 has a thickness equal to a depth of each slot 22.

Each chip 30 includes a substrate 32, a first semiconductor layer 34, a light emitting layer 36 and a second semiconductor layer 38. The substrate 32 may be made of metal such as nickel. The substrate 32 can form ohmic contact with the first semiconductor layer 34, thereby facilitating current conduction within the chip 30. The substrate 22 defines a groove 322 in a bottom face thereof. The groove 322 has an area identical to that of the protrusion 24. A depth of the groove 322 is also identical to the thickness of the protrusion 24. Two blocks 32 are formed at two opposite sides of the groove 322. Each block 324 has an area identical to that of each slot 22, and a thickness identical to that of each protrusion 24. The groove 322 of the substrate 22 can fittingly receive the protrusion 24 of the base 20 therein, and the two blocks 324 of the substrate 32 can be fittingly received in the two slots 22 of the base 20, respectively. Thus, the chip 30 can be precisely mounted on the base 20 by positioning the protrusion 24 in the groove 322, and the blocks 32 in the slots 22, respectively.

The first semiconductor layer 34 may be a P-type semiconductor layer, the second semiconductor layer 38 may be an N-type semiconductor layer, and the light emitting layer 36 may be a multiple quantum well layer. The first semiconductor layer 34, the second semiconductor layer 38 and the light emitting layer 36 may be made of semiconductor material such as GaN, InGaN, AlInGaN or the like. The light emitting layer 36 can emit light when being activated (i.e., powered).

An electrode 39 is formed on a top face of the second semiconductor layer 38. The electrode 39 may be made of metal such as nickel, golden or an alloy thereof. The electrode 39 has an area smaller than that of the second semiconductor layer 38.

A method for manufacturing the chip unit 10 is also disclosed. The method mainly includes several steps as follows.

Figure 3:
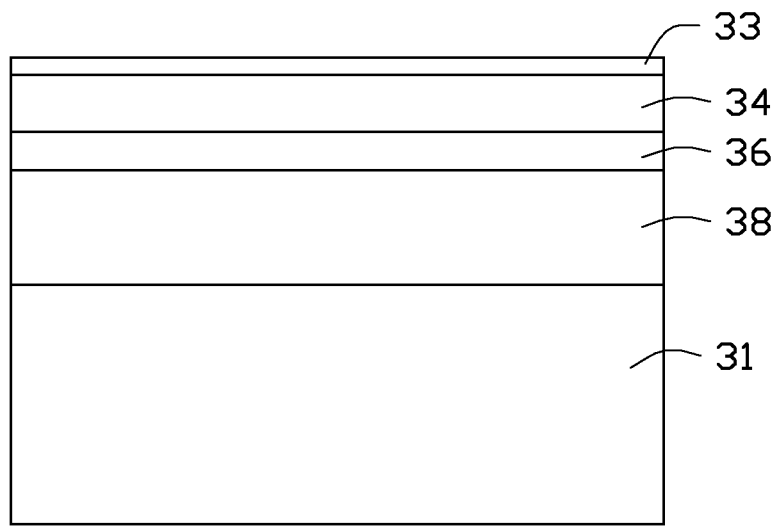
FIG. 3 shows a first step of manufacturing the chip unit of FIG. 1.

Firstly, also referring to FIG. 3, a base 20 and two original chips (not labeled) are provided. The base 20 is the same as that shown in FIGS. 1-2. Each original chip includes a temporary substrate 31, a second semiconductor layer 38, a light emitting layer 36, a first semiconductor layer 34 and a connecting layer 22 sequentially stacked on the temporary substrate 31. In this embodiment, the temporary substrate 31 may be a sapphire or a silicone substrate. The second semiconductor layer 38 is an N-type semiconductor layer, and the first semiconductor layer 34 is a P-type semiconductor layer. The connecting layer 33 may be formed by electroplating nickel on a top face of the first semiconductor layer 34. The connecting layer 33 may have a thickness less than that of the first semiconductor layer 34, the second semiconductor layer 38 and the light emitting layer 36.

Figure 4:
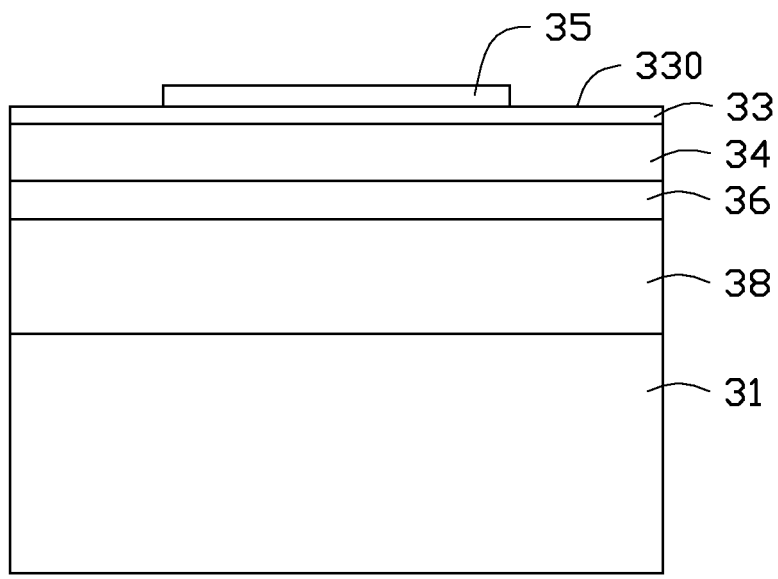
FIG. 4 shows a second step of manufacturing the chip unit of FIG. 1.

Also referring to FIGS. 4, a photoresist layer 35 is then formed on a top face 330 of the connecting layer 33. The photoresist layer 35 may be formed by coating photoresist material on the top face 330 of the connecting layer 33, and then etching the photoresist material by photolithography, until a predetermined shape of the photoresist layer 35 as shown in FIG. 4 is formed. In this embodiment, the photoresist layer 35 has an area smaller than that of the connecting layer 33. The photoresist layer 35 is located at a central area of the top face 330 of the connecting layer 33. The photoresist layer 35 has a thickness slightly larger than that of the connecting layer 33.

Figure 5:
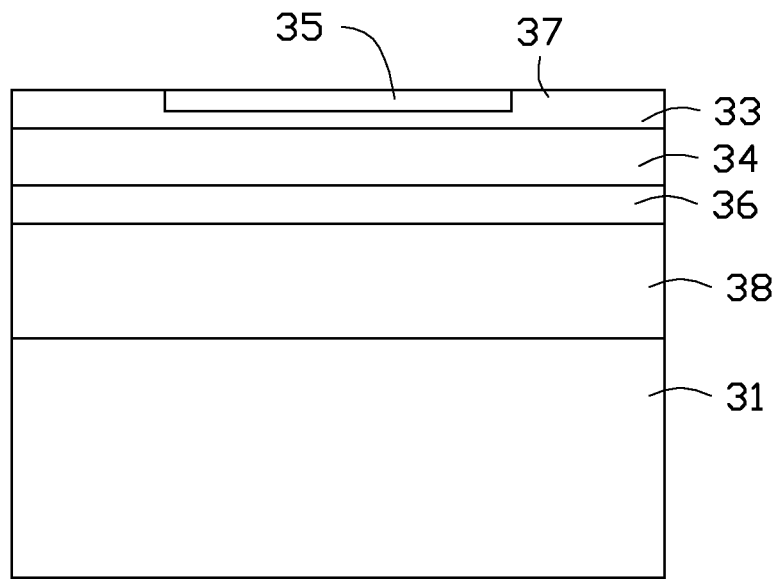
FIG. 5 shows a third step of manufacturing the chip unit of FIG. 1.

Also referring to FIG. 5, a supporting layer 37 is further formed on an exposed area of the top face 330 of the connecting layer 33 by electroplating nickel thereon. The supporting layer 37 has two parts located at two opposite sides of the photoresist layer 35. The supporting layer 37 has a top face leveled with that of the photoresist layer 35. The supporting layer 37 and the connecting layer 33 cooperatively form the substrate 32 which has an appearance of a single monolithic piece.

Figure 6:
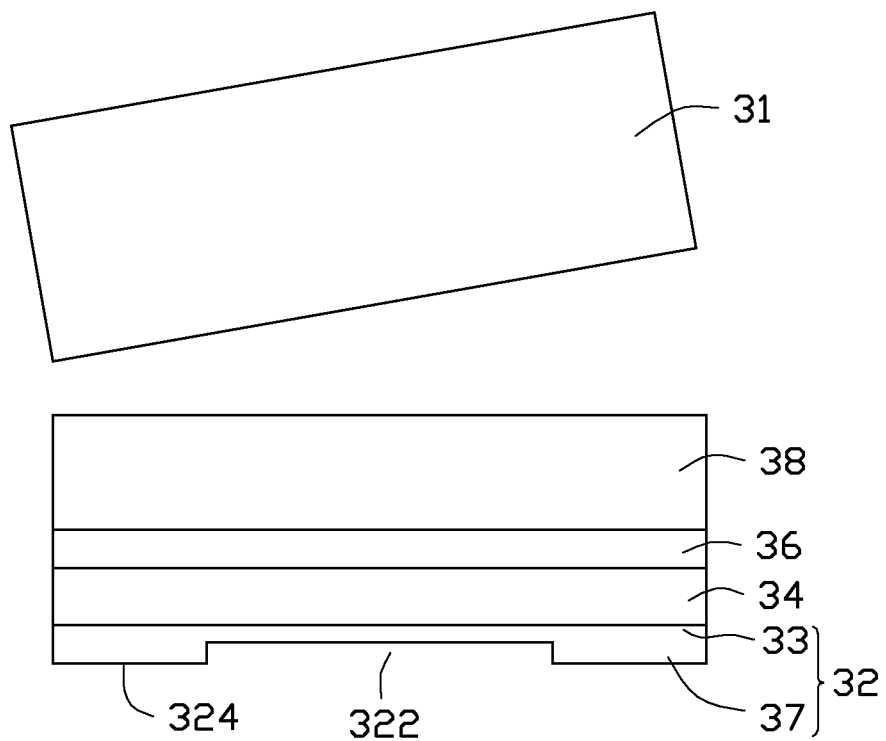
FIG. 6 shows a fourth step of manufacturing the chip unit of FIG. 1.
Figure 7:
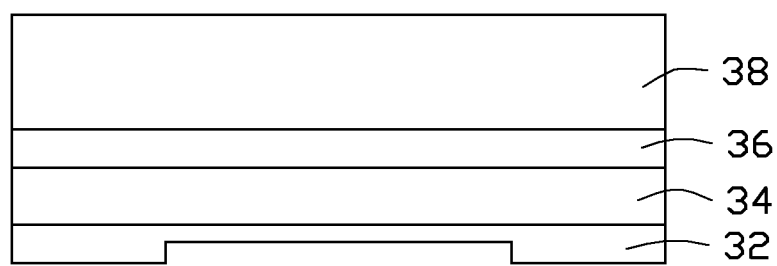
FIG. 7 shows a fifth step of manufacturing the chip unit of FIG. 1.

Also referring to FIGS. 6-7, the photoresist layer 35 and the temporary substrate are 31 are then removed from the substrate 32 and the second semiconductor layer 38, respectively. The photoresist layer 35 may be removed by dipping the photoresist layer 35 in an etching solution, and the temporary substrate 31 may be removed by using laser beam to radiate the temporary substrate 31. After removing the photoresist layer 35, the groove 322 of the substrate 32 is exposed, and the two blocks 324 are located at two opposite sides of the groove 322. In FIGS. 6-7, the semi-product constructed by the substrate 32, the first semiconductor layer 34, the second semiconductor layer 38 and the light emitting layer 36, is reversed relative to that shown in FIG. 5.

Figure 8:
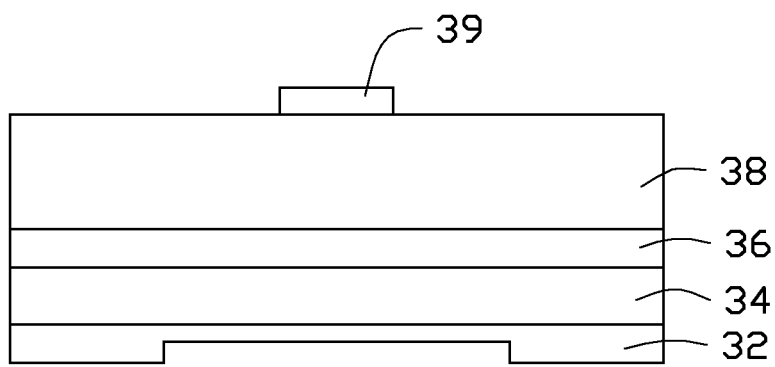
FIG. 8 shows a sixth step of manufacturing the chip unit of FIG. 1.

Also referring to FIG. 8, an electrode 39 is formed on a top face of the second semiconductor layer 38 by metal deposition, thereby forming the chip 30 as that shown in FIGS. 1-2. The electrode 39 and the substrate 32 are located at two opposite ends of the chip 30.

Finally, each chip 30 is mounted on the base 20 by engaging the protrusion 24 of the base 20 in the groove 322 of each chip 30, and engaging the two blocks 324 of each chip 30 in the two slots 22 of the base 20. Therefore, each chip 30 is precisely mounted on the base 20 without being located askew or even overlapping adjacent chips 30.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing a chip unit, comprising:
making a base and a chip, the chip comprising a substrate, a first semiconductor layer, a light emitting layer and a second semiconductor layer, the base having a protrusion, and the substrate having a groove;
disposing the chip on the base by fitting the protrusion into the groove;
wherein the chip is made by making an original chip comprising a temporary layer, the first semiconductor layer, the light emitting layer and the second semiconductor layer and a connecting layer;
wherein the chip is made by further forming a photoresist layer on the connecting layer, a part of the connecting layer being covered by the photoresist layer and another part of the connecting layer being exposed; and
wherein the chip is made by further forming a supporting layer on the exposed another part of the connecting layer, the supporting layer and the connecting layer cooperatively forming the substrate as a monolithic piece and being made of a same metallic material.

2. The method of claim 1, wherein the connecting layer is electroplated on the first semiconductor layer.

3. The method of claim 1, wherein the supporting layer has a face flush with that a face of the photoresist layer.

4. The method of claim 1, wherein the chip is made by further removing the photoresist layer and the temporary layer from the original chip.

5. The method of claim 4, wherein the chip is made by further forming an electrode on the second semiconductor layer after the photoresist layer and the temporary substrate are removed.

6. The method of claim 5, wherein the original chip is reversed after forming the supporting layer and before forming the electrode.

7. The method of claim 1, wherein the first semiconductor layer is a P-type semiconductor layer, and the second semiconductor layer is an N-type semiconductor layer.

8. The method of claim 1, wherein the substrate is made of nickel.

* * * * *